United States Patent
Iida et al.

(10) Patent No.: US 8,216,371 B2
(45) Date of Patent: Jul. 10, 2012

(54) SINGLE CRYSTAL MANUFACTURING APPARATUS AND METHOD

(75) Inventors: Tetsuhiro Iida, Omura (JP); Shin Matsukuma, Omura (JP)

(73) Assignee: Sumco Techxiv Corporation, Nagasaki (JP)

( * ) Notice: Subject to any disclaimer, the term of this patent is extended or adjusted under 35 U.S.C. 154(b) by 496 days.

(21) Appl. No.: 12/311,111

(22) PCT Filed: Jul. 20, 2007

(86) PCT No.: PCT/JP2007/064363
§ 371 (c)(1),
(2), (4) Date: Mar. 19, 2009

(87) PCT Pub. No.: WO2008/038450
PCT Pub. Date: Apr. 3, 2008

(65) Prior Publication Data
US 2009/0293800 A1    Dec. 3, 2009

(30) Foreign Application Priority Data

Sep. 27, 2006 (JP) .................... 2006-262632

(51) Int. Cl.
C30B 35/00 (2006.01)
C30B 15/14 (2006.01)
C30B 15/10 (2006.01)
C30B 15/20 (2006.01)
(52) U.S. Cl. ........ 117/202; 117/201; 117/208; 117/217; 117/222
(58) Field of Classification Search .............. 117/15, 117/202, 208, 217, 222; 219/424, 426
See application file for complete search history.

(56) References Cited

U.S. PATENT DOCUMENTS

| 4,556,784 A | | 12/1985 | Nakai |
| 4,863,554 A | * | 9/1989 | Kawasaki et al. ............ 117/3 |
| 5,485,802 A | * | 1/1996 | Altekruger et al. .......... 117/14 |

(Continued)

FOREIGN PATENT DOCUMENTS

JP    A-48-46573    7/1973
(Continued)

OTHER PUBLICATIONS

U. Ekhult et al., "Infra-Red Assisted Czochralski Growth of Silicon Crystals" *Journal of Crystal Growth*, vol. 98, No. 4, Dec. 1, 1989, pp. 793-800.

(Continued)

*Primary Examiner* — Stanley Silverman
*Assistant Examiner* — Diana J Liao
(74) *Attorney, Agent, or Firm* — Posz Law Group, PLC (57) ABSTRACT

A Czochralski single crystal manufacturing apparatus uses multiple heaters to improve the controllability of crystal diameter. The power supplied to the multiple heaters is controlled so as to bring the pulling up speed close to a predetermined speed set value, and so as to bring the heater temperatures close to predetermined target temperature values. The ratio of electrical power between the heaters is controlled to agree with a predetermined power ratio set value which varies according to the crystal pulling up length, and the heater temperatures change along with this change, which causes disturbance to the diameter control. To compensate for this, heater temperature changes along with the power ratio set value change are taken into account in advance in the temperature set values. Accordingly, along with change of the power ratio set value, the temperature set values change to values appropriate for the current power ratio set value.

12 Claims, 6 Drawing Sheets

U.S. PATENT DOCUMENTS

| | | | |
|---|---|---|---|
| 6,355,910 B1* | 3/2002 | Seidl et al. | 219/426 |
| 7,390,361 B2* | 6/2008 | Iida et al. | 117/217 |
| 2005/0188918 A1* | 9/2005 | Abrosimov et al. | 117/200 |
| 2006/0005761 A1 | 1/2006 | Kulkarni et al. | |

FOREIGN PATENT DOCUMENTS

| | | |
|---|---|---|
| JP | A-59-69492 | 4/1984 |
| JP | A-62-153191 | 7/1987 |
| JP | A-09-118585 | 5/1997 |
| JP | B2-2681115 | 8/1997 |
| JP | A-2000-203987 | 7/2000 |
| JP | A-2002-321995 | 11/2002 |
| WO | WO 99/63134 A1 | 12/1999 |

OTHER PUBLICATIONS

E. Olivari et al., "The use of a reduced model for on-line simulations of the Czochralski growth of single crystals" *Journal of Crystal Growth*, vol. 180, No. 3-4, Oct. 1, 1997, pp. 627-637.

Wilde et al., "Diameter stabilization of Czochralski-grown $Sr_{0.61}Ba_{0.39}Nb_2O_6$ (SBN) crystals using real-time computer control" *Journal of Crystal Growth*, vol. 113. Mp/3-4, Sep. 1, 1991, pp. 337-359.

European Search Report dated Jul. 29, 2010 issued from the European Patent Office for the corresponding European patent application No. 07791100.6-2122.

International Search Report mailed on Aug. 21, 2007 for the corresponding International patent application No. PCT/JP2007/064363 (English translation enclosed).

\* cited by examiner

SINGLE CRYSTAL MANUFACTURING APPARATUS AND METHOD

CROSS REFERENCE TO RELATED APPLICATIONS

This application is a U.S. national stage application of PCT/JP2007/064363 filed on Jul. 20, 2007, and claims priority to, and incorporates by reference, Japanese Patent Application No. 2006-262632 filed on Sep. 27, 2006.

TECHNICAL FIELD

The present invention relates to a single crystal manufacturing apparatus and method according to the Czochralski method (the CZ method).

BACKGROUND ART

In the silicon wafer the density of interstitial oxygen (hereinafter termed "Oi") is one very important product characteristic for determining the performance of a semiconductor device. The Oi density is determined during the pulling up process for a silicon single crystal according to the CZ method. In the crystal pulling up process, the rotational speeds of the crucible and the crystal, and the flow rate of an inactive gas such as argon or the like within the chamber and so on, are used as manufacturing parameters. However there is the problem that, with only these parameters, there is a limit to the range over which it is possible to control the Oi density, so that the range for good product quality which matches the Oi spec requested from the side of the device manufacturer is narrow (in other words, the yield rate is bad).

In order to ameliorate this problem, techniques are known for enhancing the yield rate by providing multiple heaters, arranged along the vertical direction within the chamber (see Patent References #1 and #2). In Patent Reference #1, it is disclosed to widen the control range for the Oi density, and to improve the yield rate, by changing the power supplied to each of the multiple heaters according to the pulling up length of the crystal. And, in Patent Reference #2, it is disclosed to enhance the controllability of the Oi density by changing the power supplied to each of the multiple heaters along a curve which is specified according to the pulling up rate of the crystal.

Patent Reference #1: Japanese Laid-Open Patent Publication Showa 62-153191;

Patent Reference #2: Patent Publication 2,681,115.

According to these prior art techniques, the Oi control range is widened by using a multiple heaters. However, the obverse of this is that the controllability of the crystal diameter becomes bad, and the actual diameter sometimes becomes excessively great as compared to the required diameter and sometimes becomes excessively small; and, as a result, the product yield rate becomes bad. Thus, it is not possible to anticipate enhancement of the yield rate by using a multiple heater in this manner.

SUMMARY

Accordingly, in a single crystal manufacturing apparatus which comprises multiple heatersmultiple heaters, it is an object of the present invention to improve the controllability of the crystal diameter.

According to the present invention, a single crystal manufacturing apparatus according to the Czochralski method includes: multiple heaters for applying heat to a crucible; an elevating/lowering device which pulls up a crystal from said crucible; a temperature measurement device which measures an applied heat temperature, generated by heat applied by said heaters, at a predetermined site of said single crystal manufacturing apparatus; a diameter measurement device which measures the diameter of said crystal; a speed measurement device which measures the pulling up speed of said elevating/lowering device; and a control device which controls the pulling up speed by said elevating/lowering device and the electrical power of said multiple heaters. And said control device sets a diameter set value, a speed set value, a variable power ratio temperature set value, and a power ratio set value; inputs the measured values from said temperature measurement device, said diameter measurement device, and said speed measurement device; and controls said pulling up speed by said elevating/lowering device and the electrical power of said multiple heaters on the basis of the values measured by said temperature measurement device, said diameter measurement device, and said speed measurement device, and of said diameter set value, said speed set value, and said variable power ratio temperature set value, while making the power ratio of said multiple heaters agree with said power ratio set value. Here, it is arranged for said power ratio set value to change according to the state of progression of the crystal pulling up process, and for said variable power ratio temperature set value to change along with the change of said power ratio set value, so as to become a temperature value which corresponds to the current value of said power ratio set value.

Generally, during the crystal pulling up process, the of the electrical power to the multiple heaters (in other words, the power ratio between the upper and lower heaters) changes according to the power ratio set value, but the measured value of the applied heat temperature changes according to change of this power ratio, and this constitutes a disturbance to the diameter control. With this single crystal manufacturing apparatus, as the temperature set value for the applied heat temperature, a fixed power ratio temperature set value corresponding to one fixed power ratio is not used, but rather a variable power ratio temperature set value is employed, which changes along with change of the power ratio set value. This variable power ratio temperature set value changes during the crystal pulling up process, so as to become a temperature value which corresponds to the current value of the power ratio set value. This type of variable power ratio temperature set value can be set so as to compensate more effectively for the disturbance caused by change of the measured value of the applied heat temperature due to change of the power ratio. As a result, when multiple heaters are provided, the controllability of the crystal diameter is enhanced.

In a preferred embodiment, said variable power ratio temperature set value is set so as to compensate for change of the measured value of said applied heat temperature which occurs due to change of said power ratio set value. As a method for performing this setting, for example, a data table may be prepared in advance, in which is defined a relationship between the measured value of said applied heat temperature which changes according to change of said power ratio set value during the crystal pulling up process, and the position of said crystal at the time point that the measured values are obtained (i.e. the crystal pulling up length), and the variable power ratio temperature set value may be set on the basis of this data table. Furthermore, as a concrete profile for the variable power ratio temperature set value, for example, a profile may be employed in which, when the power ratio set value changes from a first ratio value to a different second ratio value, the variable power ratio temperature set value shifts from a first fixed power ratio temperature set value which corresponds to said first ratio, to a second fixed power ratio temperature set value which corresponds to said second ratio. By using this type of variable power ratio temperature set value, it is possible to compensate even more effectively for disturbances such as change of the measured value of the applied heat temperature due to change of the power ratio, and thus to enhance the controllability of the crystal diameter.

In a preferred embodiment, the control device may be adapted to control said pulling up speed so as to bring the measured value of said diameter close to said diameter set value, to determine a temperature target value by adjusting said variable power ratio temperature set value so as to bring the measured value of said pulling up speed close to said speed set value, and to control the electrical power to said multiple heaters so as to bring the measured value of said applied heat temperature close to said temperature target value, while making the power ratio of said multiple heaters agree with said power ratio set value.

Since, by using a control device having this type of structure, it is possible to control the crystal diameter mainly by control of the applied heat temperature, while controlling the pulling up speed as closely as possible according to the speed set value, and while enhancing the controllability of the density of point defects included in the crystal, accordingly it becomes yet easier to enhance the controllability of the crystal diameter; and the above facts and the beneficial operational effects due to the above described variable power ratio temperature set value work synergistically.

The control device may be adapted to set a variable power ratio temperature set value which is determined in advance, and to store it; or, alternatively, it may be adapted to calculate the variable power ratio temperature set value automatically, on the basis of information which specifies a relationship between said power ratio and said applied heat temperature, and said power ratio set value. Although the profile of the power ratio set value also changes if the specification of the crystal manufacturing apparatus or the specification of the crystal which it is desired to manufacture changes, still, if the control device is adapted to calculate the variable power ratio temperature set value automatically on the basis of the power ratio set value, as described above, then this control device is able simply and easily to answer to changes of the specification of the crystal manufacturing apparatus or the specification of the crystal which it is desired to manufacture.

DETAILED DESCRIPTION

In the following, a crystal manufacturing apparatus of a multi-stage heater type which uses the Czochralski method, according to an embodiment of the present invention, will be explained.

First, the theory for enhancing the controllability of crystal diameter which is employed in this embodiment will be explained in a simple manner. In other words, the point is that a temperature program for controlling the temperatures of the heaters (or the temperatures of heat shields which surround the heaters) is set while taking into account temperature fluctuations due to anticipated changes of the power ratio of the heaters.

Generally, with the crystal pulling up process according to the Czochralski method, the melt temperature is changed and the crystal diameter is controlled, principally by adjusting the electrical power supplied to the heater. In this control of the electrical power to the heater, the temperature of the heater itself, or the temperature of a heat shield which surrounds the heater, is measured with an optical temperature measurement device (a pyrometer) or the like, and the heater electrical power is controlled so that this measured temperature matches a temperature set value which is programmed in advance. The profile of the temperature set value is set so as to change along a curve which is specified according to the pulling up length of the crystal during the pulling up process (in other words, according to the state of progression of the pulling up process). However the disturbances in the chamber are considerable, and it is not possible to form the crystal in the desired shape only with a set temperature program (a temperature set value). Thus, it is normal to perform diameter control while correcting the temperature set value as required according to automatic control such as PID or the like, by constantly measuring the actual crystal diameter and changing the target temperature according thereto.

However, in the case of a crystal manufacturing apparatus which employs multiple heaters, since the temperature of each of the heaters changes when the power ratio of the heaters changes during the crystal pulling up process, accordingly the temperature detected by the pyrometer also changes This temperature change is one type of disturbance to the control of the crystal diameter. This disturbance may somewhat be cancelled by automatic control, but, since the controllability of the diameter is poor as compared with a single heater type crystal manufacturing apparatus, accordingly it can constitute a cause for deterioration of the product yield rate.

Thus, with the crystal manufacturing apparatus according to this embodiment, the temperature program is set in advance so as to take into account temperature fluctuations due to change of the anticipated power ratio of the heaters. Due to this, the controllability of the crystal diameter is improved almost to a level which compares favorably with that of a single heater type apparatus, and the product yield rate is also enhanced. In the following, the crystal manufacturing apparatus according to this embodiment will be explained in concrete terms with reference to the drawing.

Figure 1:
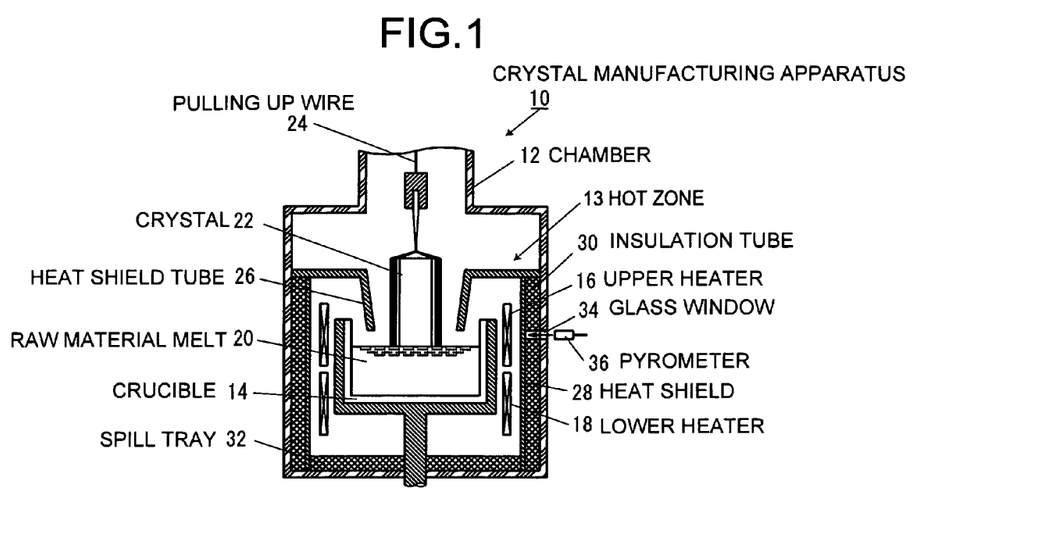
FIG. 1 is a sectional view showing the main structure of a chamber portion of a crystal manufacturing apparatus according to this embodiment.

FIG. 1 shows the main structure of a chamber portion of the crystal manufacturing apparatus according to this embodiment.

As shown in FIG. 1, a hot zone 13 is installed in a chamber 12 of this crystal manufacturing apparatus 10, and a crucible 14 is disposed within the hot zone 13. The hot zone 13 comprises multiple heaters, arranged along the vertical direction around the neighborhood of the crucible 14, for example two stage heaters—an upper heaterupper heater 16 and a lower heater 18. The heaters 16 and 18 are made from carbon and generate heat by electric heating, and a raw material liquid melt 20 is created in the crucible 14 by this heating. A seed crystal is attached to the end of a pulling up wire 24, this seed crystal is dipped into the raw material liquid melt 20, and thereafter, by winding up the pulling up wire 24, a single crystal 22 which grows from the seed crystal is continuously pulled up. It should be understood that the number of stages of the heaters 16 and 18 is not limited to being two; there could also be more thereof, and moreover it would also be acceptable to include, not only these heaters in the neighborhood of the side wall of the crucible 14, but also a so-called bottom heater which is disposed in the neighborhood of the bottom surface of the crucible 14.

The hot zone 13 also comprises a heat shield tube 26 which is disposed above the heaters 16 and 18 and the crucible 14, a heat shield 28 and an insulation tube 30 which surround the side surfaces of the heaters 16 and 18, and a spill tray 32 which is disposed below the heaters 16 and 18 and the crucible 14, and these are also made from carbon.

A glass window 34 is formed in the side wall of the chamber 12, just at a height which corresponds to the upper heater 16, and a through hole is opened through the insulation tube 30 at a spot which corresponds to this glass window 34. A pyrometer 36 is disposed outside the glass window 34, and this pyrometer 36 passes through a hole pierced in the glass window 34, thus being adapted to measure the temperature of the heat shield 28 in the neighborhood of the upper heater 16. It should be understood that the temperature which is the subject of measurement here need only be a temperature which changes along with change of the electrical power supplied to the heaters 16 and 18, so that, from this aspect, it does not need to be the temperature of the heat shield 28; it may also be the temperature of the heater 16 or that of the heater 18, or the temperature of the crucible 14. In any of these cases, the temperature which is the subject of being measured here will hereinafter be termed the "applied heat temperature", with the meaning that it is a temperature which is generated by the heat applied by the heaters 16 and 18.

Figure 2:
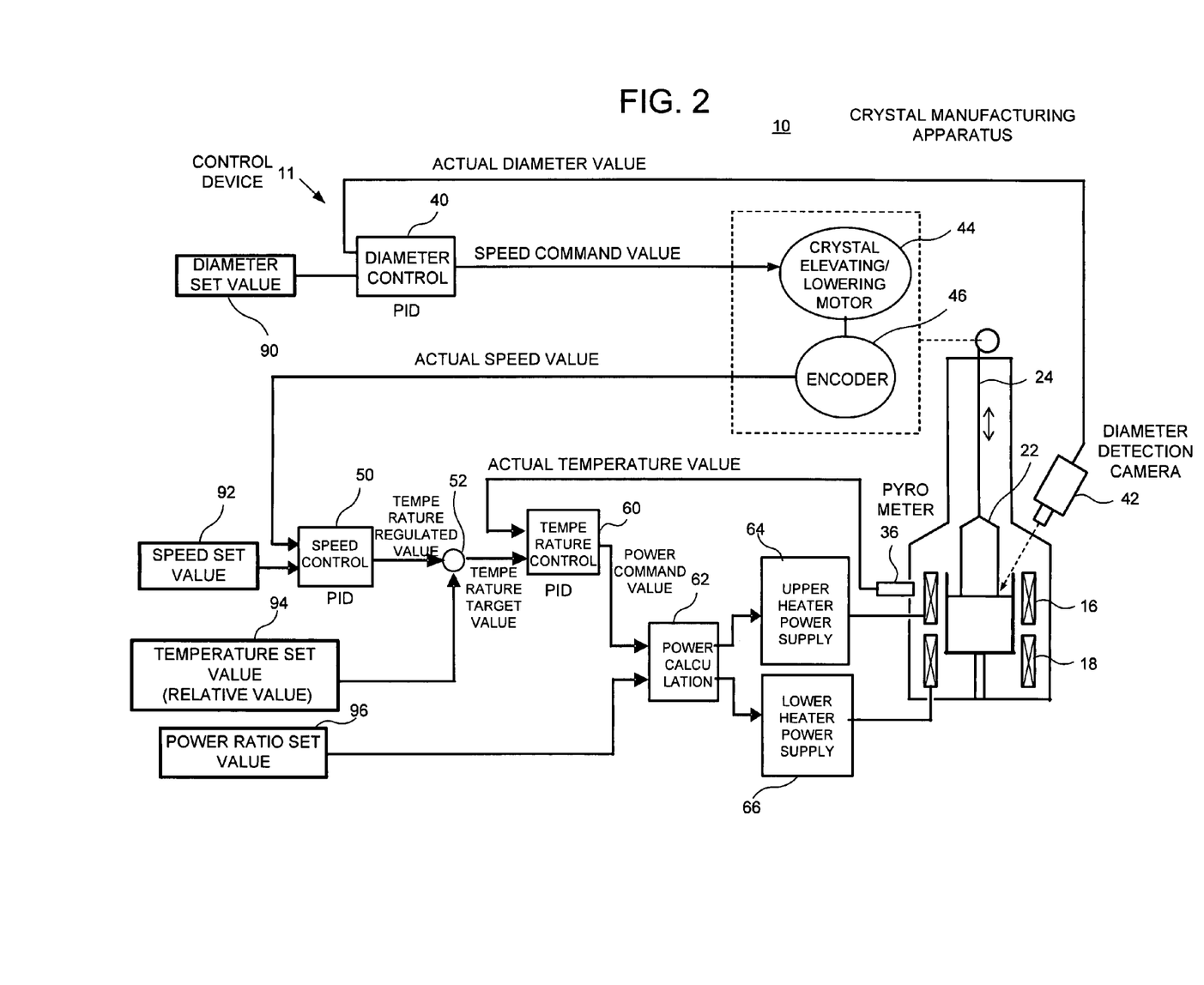
FIG. 2 is a block diagram showing the main structure of a control device of a crystal manufacturing apparatus according to this embodiment.

FIG. 2 shows the main structure of a control device of the crystal manufacturing apparatus according to this embodiment.

As shown in FIG. 2, this control device 11 for the crystal manufacturing apparatus 10 comprises a diameter setter 90, a speed setter 92, a temperature setter 94, and a power ratio setter 96, which respectively set a diameter set value, a speed set value, a temperature set value, and a power ratio set value. As one example, these setters 90, 92, 94, and 96 may be implemented using one or a plurality of storage devices which store diameter set values, speed set values, temperature set values, and power ratio set values which have been set (programmed) in advance, in the format of, for example, data tables or the like. The diameter set value is a target value for the diameter of the single crystal 22. The speed set value is a target value for the pulling up speed of the single crystal 22. The temperature set value is a "fundamental" target value for the applied heat temperature, and this takes the applied heat temperature value when the seed is dipped as a reference, and is expressed as a temperature difference (in other words, a relative temperature) with respect to this reference. And the power ratio set value is a target value for the power ratio of the heaters 16 and 18 (in this specification, the ratio of the electrical power of the upper heater to the total electrical power of the upper heater 16 and the lower heater 18 is used).

Here, the temperature set value is set so as to have a specified profile which changes according to the pulling up length of the crystal 22 during the pulling up process (in other word, according to the state of progression of the pulling up process). Moreover, the power ratio set value is also set so as to have a specified profile which changes according to the pulling up length of the crystal 22 during the crystal pulling up process. The point to which attention must here be paid is that, in the profile for the temperature set value, change of the applied heat temperature along with change in the power ratio according to the profile of the power ratio set value is taken into account in advance. This point will subsequently be explained in concrete terms.

Not only the set values described above for the diameter, the speed, the temperature, and the power ratio, but also target values for the rotational speed of the crystal 22 and for the rotational speed of the crucible 14 and so on, are programmed into the control device 11 in advance. However, since these are not parameters for directly controlling the crystal diameter, explanation thereof will be omitted.

As shown in FIG. 2, this control device 11 comprises a diameter controller 40, a speed controller 50, and a temperature controller 60. Each of the diameter controller 40, the speed controller 50, and the temperature controller 60 is a controller which is adapted to calculate an actuation value for performing PID calculation for the deviation between a set value and a feedback value.

During the pulling up process, the diameter controller 40 compares the value of the diameter of the crystal 22 at the liquid surface, which is detected by a diameter detection camera 42 (hereinafter termed the "actual diameter value"), with a diameter set value which is programmed in advance, and controls the pulling up speed of the crystal 22 with the crystal elevating/lowering motor 44, so that the pulling up speed is reduced if the actual diameter value is less than the diameter set value, and so that the pulling up speed is increased, if the actual diameter is greater than the diameter set value. In other words, the diameter controller 40 obtains a speed command value by performing predetermined PID calculation upon the deviation between the actual diameter value and the diameter target value, and outputs this speed command value to the crystal elevating/lowering motor 44. And the crystal 22 is thus pulled up at a speed according to this speed command value. It should be understood that, as the method for measuring the diameter of the crystal 22, the method of using the diameter detection camera 42 described above is only one method given by way of example; it would also be possible to utilize some other method, for example the "diameter detection method by weight" of measuring the weight change of the crystal 22 per unit time period, and deriving its diameter therefrom, or the like.

The speed controller 50 ascertains the value of the actual pulling up speed (hereinafter termed the "actual speed value") from the signal from an encoder 46 which is coupled to the crystal elevating/lowering motor 44, and compares this actual speed value with a speed set value which is programmed in advance. Here, the speed controller 50 and the temperature controller 60 are combined, so that control of the applied heat temperature is performed so as to bring the actual speed value close to the speed set value. In other words, the speed controller 50 calculates a temperature regulated value so that the actual speed value comes close to the speed set value, by performing predetermined PID calculation upon the deviation between the actual speed value and the speed set value.

This temperature regulated value is inputted to an adder 52, and is added to a temperature set value which is programmed in advance. Due to this, a value consisting of the temperature set value which is programmed in advance (in other words the "fundamental" temperature target value), adjusted by the above described temperature regulated value, is confirmed as the "final" temperature target value, and is inputted to the temperature controller 60.

The temperature controller 60 compares together the actual value of the applied heat temperature as measured by the pyrometer 36 (hereinafter this will be termed the "actual temperature value"), and the above described final temperature target value, and outputs a power command value so as to bring the actual temperature value close to the temperature target value. In other words, the temperature controller 60 calculates a power command value for bringing the actual temperature value close to the temperature target value, by performing predetermined PID calculation upon the deviation between the actual temperature value and the temperature target value, and inputs this power command value to a power calculator 62. And the power calculator 62 inputs the power ratio set value, and, along with making the power ratio of the upper and lower heaters 16 and 18 accord with the power ratio set value, also calculates an upper heater power command value and a lower heater power command value so that the total electrical power of the upper and lower heaters 16 and 18 agrees with the power command value, and outputs the upper heater power command value and the lower heater power command value to an upper heater power supply 64 and a lower heater power supply 66 respectively. And the upper heater power supply 64 and the lower heater power supply 66 control supply of electrical power to the upper heater 16 and supply of electrical power to the lower heater 18, respectively, so as to agree with the upper heater power command value and the lower heater power command value, respectively.

With the control device 11 having the structure described above, cascade control is performed in which: with regard to the crystal diameter, the pulling up speed is controlled so as to bring the actual diameter of the crystal 22 close to the diameter set value; on the other hand, with regard to the applied heat temperature, the temperature set value is adjusted and the temperature target value is determined, so as to bring the pulling up speed of the crystal 22 close to the speed set value; and the heater electrical power is controlled so as to bring the actual temperature of the applied heat temperature close to the temperature target value. The reason for employing this type of control method is as follows. Namely, since generally the time constant for the applied heat temperature is large (in other words, it takes quite a time from when the applied heat temperature changes until the crystal diameter changes), accordingly this is suitable for being used as a parameter for determining the crystal shape on the macro level. By contrast, since the time constant for the pulling up speed is small (it takes a relatively short time period from when the pulling up speed changes until the crystal diameter changes), accordingly this is suitable for being used as a parameter for controlling the crystal diameter immediately as required, in response to disturbances to the control, which occur continuously. However, since the pulling up speed is a very important factor for determination of the density of occurrence of point defects in the crystal, accordingly it is desirable for it to be controlled as closely as possible to the planned speed set value, and it would be ideal for it to be possible to control the crystal diameter only with the applied heat temperature.

It should be understood that the theory of the present invention is not limited to the control device 11 according to this embodiment which employs the control method described above; it could also be applied to a control device which employs some other type of method.

Moreover, with the control device 11 having the type of structure described above, the point which deserves attention is that, in the profile of the temperature set value, change of the applied heat temperature along with change of the power ratio (i.e. of the electrical power to the upper heater divided by the total electric power to the upper and lower heaters) according to the profile of the power ratio set value is taken into account in advance. In the following, this point will be explained in concrete terms.

Figure 3:
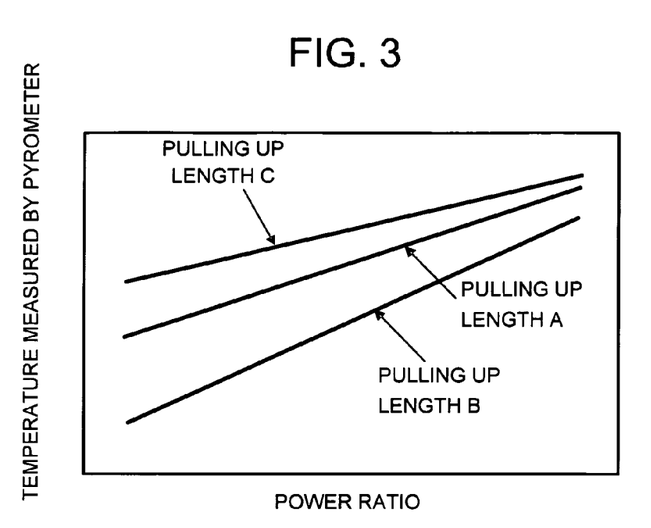
FIG. 3 shows relationships between a temperature measured by a pyrometer 36, and power ratio.

FIG. 3 shows examples of the relationship between the applied heat temperature measured by the pyrometer 36, and the power ratio, for different pulling up lengths A, B, and C. The pulling up lengths A, B, and C in FIG. 3 correspond, respectively, to the pulling up lengths A, B, and C shown in FIG. 4 which will be described hereinafter.

As shown in FIG. 3, the measured value by the pyrometer 36 of the applied heat temperature changes when the power ratio changes, even if the total electrical power to the upper and lower heaters 16 and 18 remains the same. Moreover, this measured applied heat temperature also varies according to the pulling up length. When this type of difference of the measured temperature due to the power ratio is taken into consideration, it is seen that, if the power ratio is different, then the appropriate temperature set value must also be different.

Figure 4:
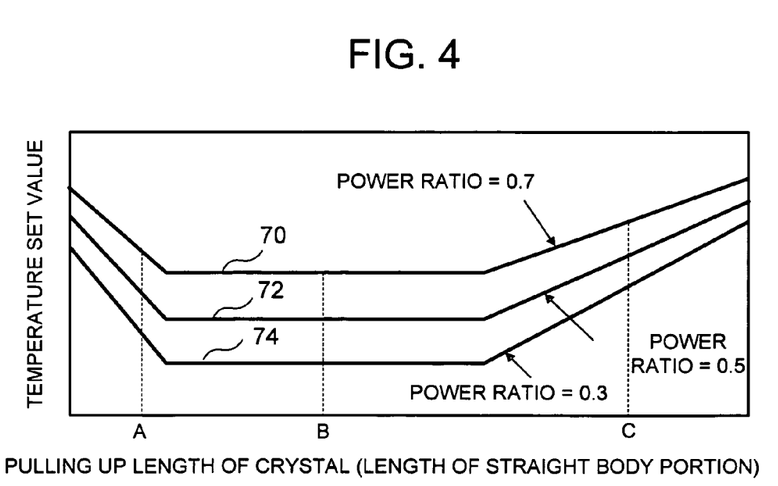
FIG. 4 is a figure showing examples of optimum temperature set values for different power ratios.

FIG. 4 shows examples of appropriate temperature set values corresponding to various different power ratios. It should be understood that, for the convenience of explanation, the example shown in the figure has been simplified as compared with reality.

As shown in FIG. 4, for example for the different power ratios 0.7, 0.5, and 0.3, there are different appropriate temperature set values 70, 72, and 74. In the following, each of these temperature set values 70, 72, and 74 will be termed a "fixed power ratio temperature set value", with the meaning that it is the appropriate temperature set value corresponding to some one fixed power ratio.

Furthermore, with the control device 11 according to this embodiment shown in FIG. 2, for the temperature set value, the fixed power ratio temperature set value 70, 72, or 74 shown in FIG. 4 is not itself employed, but rather a temperature set value which can adapt according to the variable power ratio, created based upon that fixed power ratio temperature set value 70, 72, or 74, is employed (hereinafter, this will be termed the "variable power ratio temperature set value").

Figure 5:
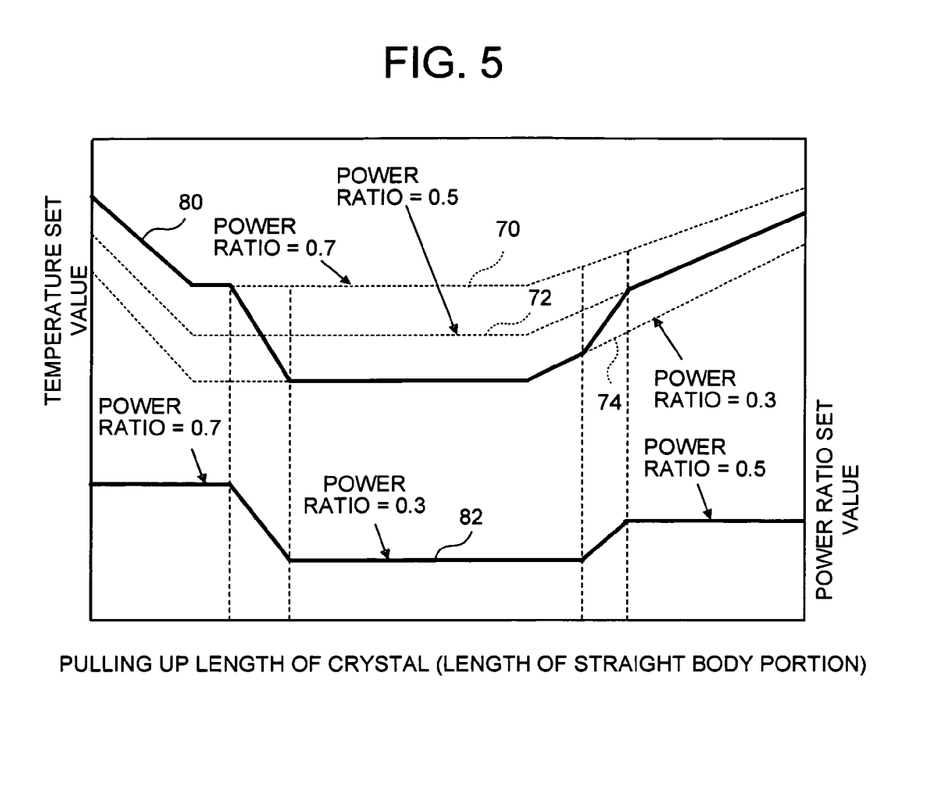
FIG. 5 is a figure showing an example of a profile of a temperature set value employed in this embodiment, which is adapted to change of power ratio, together with an example of a profile of power ratio set value.

FIG. 5 shows an example of a profile of the variable power ratio temperature set value which is used in this embodiment, together with an example of a profile of the power ratio set value.

In FIG. 5, the reference number 80 denotes the variable power ratio temperature set value, and the reference number 82 denotes the power ratio set value. The power ratio set value 82 changes according to the crystal pulling up length, for example, first to 0.7, next to 0.3, and finally to 0.5. And the variable power ratio temperature set value 80 changes along with this type of change of the power ratio set value, and is set so as to agree with the fixed power ratio temperature set value 70, 72, or 74, according to the power ratio set value 82 at the present time point. In other words, along with the power ratio set value changing from a first ratio value to a different second ratio value (for example from 0.7 to 0.3, or from 0.3 to 0.5), the variable power ratio temperature set value 80 is set so as to shift from a fixed power ratio temperature set value which corresponds to this first ratio value, to a fixed power ratio temperature set value which corresponds to the second ratio value (for example, from the set value 70 to the set value 74, or from the set value 74 to the set value 72). To put this in another manner, the variable power ratio temperature set value 80 is set so as to have a profile in which change of the measured value of the applied heat temperature due to change of the power ratio set value has been taken into account, as shown in FIG. 3. For the method for setting the variable power ratio temperature set value 80 to this type of profile, as one example, a method may be employed of preparing in advance, within the power ratio setter 96, a data table in which the relationship between the measured values of the applied heat temperature, as it changes according to change of the power ratio set value during the crystal pulling up process, and the position of the crystal (i.e. the crystal pulling up length) at the time point that each of these measured values was obtained, is defined, and the power ratio setter 96 setting the variable power ratio temperature set value on the basis of this data table (for example, reading out from this data table a variable power ratio temperature set value which has been stored therein in advance).

By using the variable power ratio temperature set value 80 which has a profile in which change of the applied heat temperature along with change of the power ratio set value is taken into account in this manner, the control device 11 shown in FIG. 2 is able to compensate for disturbance due to the temperature changing due to change of the power ratio, so that the controllability of the crystal diameter can be improved. It should be understood that the variable power ratio temperature set value 80 in this embodiment takes the applied heat temperature value when the seed is dipped as a reference, and is expressed as a temperature difference with respect to that reference (in other words, as a relative temperature).

Figure 6A:
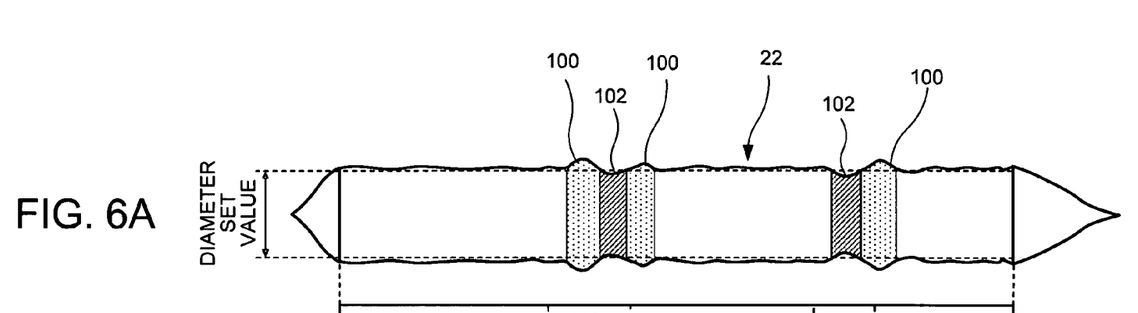
FIGS. 6A and 6B are figures showing results of testing the advantageous effects of enhancing the diameter controllability, according to this embodiment.
Figure 6B:
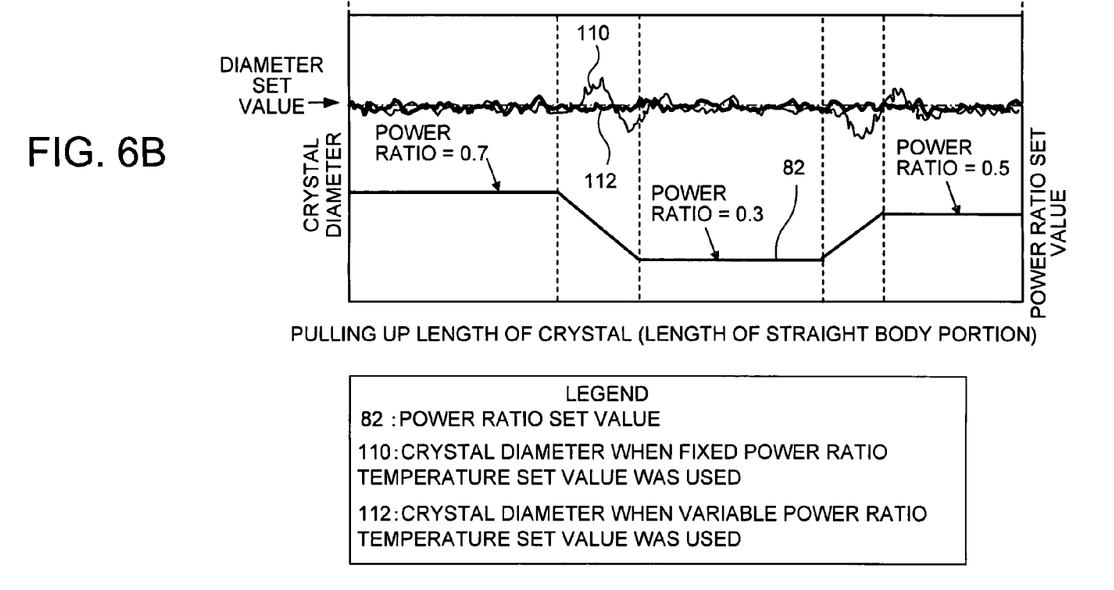

FIGS. 6A and 6B show some results of testing the advantageous effects of enhancing the diameter controllability, according to this embodiment.

In this test, with the control device 11 shown in FIG. 2, the power ratio was set as shown by the reference number 82 in FIG. 6B (or FIG. 5). And two crystals 22 were experimentally prepared using this power ratio 82, one when one fixed power ratio temperature set value was used as the temperature set value, and one when the variable power ratio temperature set value 80 according to this embodiment shown in FIG. 5 was used as the temperature set value. FIG. 6A shows an example of the shape of a crystal 22 which was manufactured in this test, when one fixed power ratio temperature set value was used as the temperature set value. And FIG. 6B shows the diameter values 110 of this crystal 22 (the one shown in FIG. 6A) which was manufactured when one fixed power ratio temperature set value was used as the temperature set value, and the diameter values 112 of a crystal 22 which was manufactured when the variable power ratio temperature set value 80 according to this embodiment shown in FIG. 5 was used, correlated with one another.

As shown in FIGS. 6A and 6B, with the power ratio 82 which changes according to the pulling up length, if a fixed power ratio temperature set value is used, then the value 110 of the diameter of the crystal 22 is unstable, and sometimes exceeds the diameter set value by more than the permitted value (the crystal portion 100 shown in FIG. 6A), while sometimes also being less than the diameter set value by more than the permitted value (the crystal portion 102 shown in FIG. 6A). In particular, prominent errors of diameter occur after the time points at which change of the power ratio takes place. By contrast, if the variable power ratio temperature set value 80 according to this embodiment is employed, deviations of the diameter value 112 from the diameter set value are kept extremely small, and the diameter value 112 is controlled to be in the vicinity of the diameter set value in a stable manner.

Now, although in the embodiment described above the variable power ratio temperature set value is determined in advance and set by being stored in the control device 11, as a variant example, it would also be acceptable to provide, in the control device 11, a device which calculates the variable power ratio temperature set value.

Figure 7:
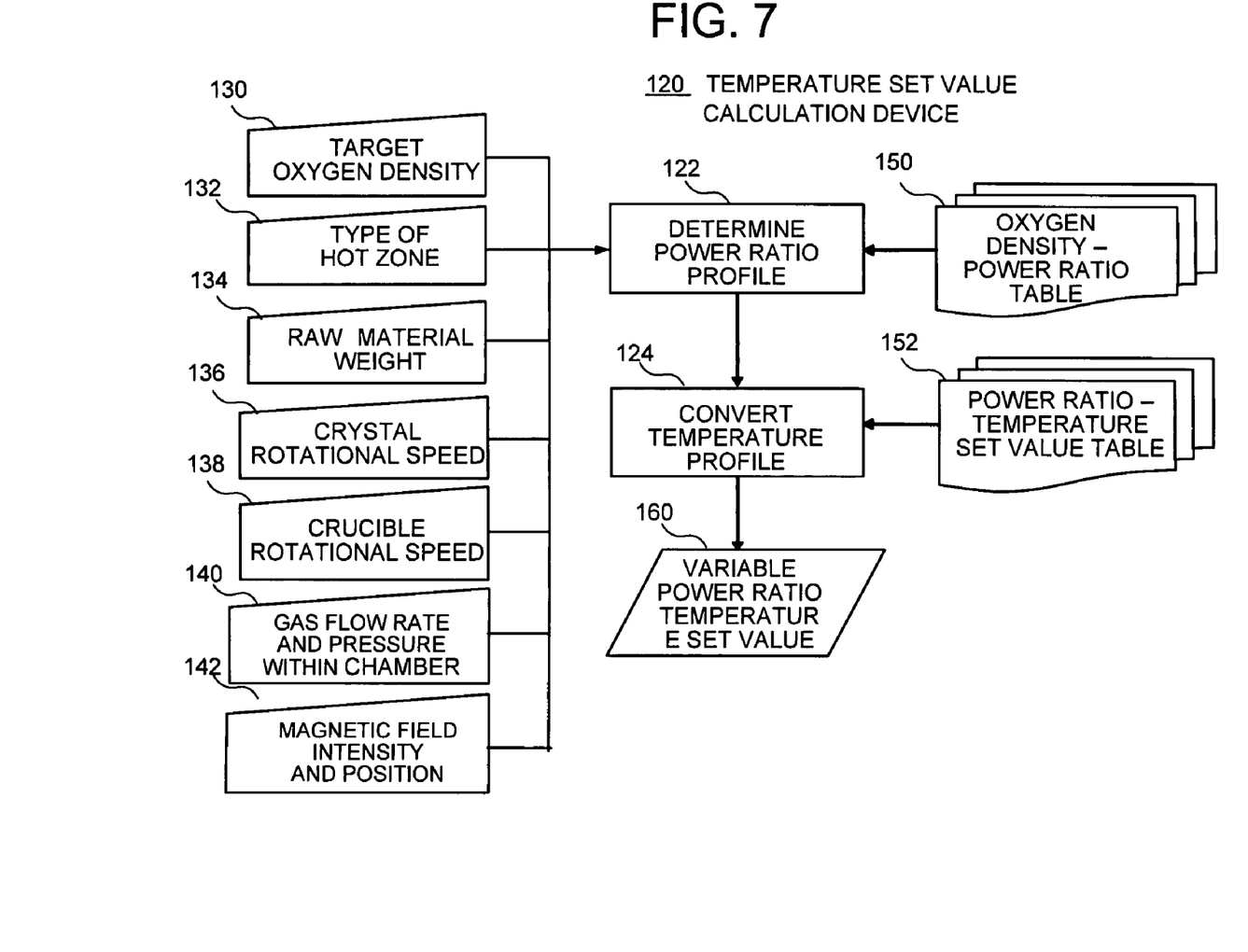
FIG. 7 is a block diagram showing an example of the structure of a device for calculating a variable power ratio temperature set value.

FIG. 7 shows an example of the structure of a device for calculating the variable power ratio temperature set value.

As shown in FIG. 7, this calculation device 120 comprises a power ratio profile determination unit 122 and a temperature profile conversion unit 124. The power ratio profile determination unit 122 is a device which determines a profile for the power ratio set value. And the temperature profile conversion unit 124 is a device which determines a profile for the variable power ratio temperature set value, on the basis of the profile of the power ratio set value from the power ratio profile determination unit 122.

The power ratio profile determination unit 122 inputs a plurality of predetermined parameter values which are to be taken into consideration in the determination of the power ratio set value, such as the target oxygen density (Oi), the type of the hot zone, the raw material weight, the crystal rotational speed, the crucible rotational speed, the gas flow rate and the pressure within the chamber, the magnetic field intensity and position, and so on. The power ratio profile determination unit contains a lookup table (or function) 150 in which the relationship between these various input parameters and the power ratio is determined in advance, and, by applying the input values of the above described plurality of parameters to this lookup table (or function) 150, a power ratio set value is calculated which has a profile best matching the above described set of input values of the plurality of parameters.

And the temperature profile conversion unit 124 inputs the profile which has been calculated by the power ratio profile determination unit 122. For each different power ratio, this temperature profile conversion unit 124 has a lookup table (or function) 152 in which a profile for the fixed temperature set value which is suitable for this power ratio is defined, and, by applying the above described power ratio set value which has been inputted to this lookup table (or function) 152, a variable power ratio temperature set value is calculated which has a profile that, along with change of the power ratio according to the power ratio set value, shifts from a fixed temperature set value which was appropriate for the power ratio value before change, to a fixed temperature set value which is appropriate for the power ratio value after change.

By installing this type of calculation device 120 to the control device 11, it becomes possible to respond to changes of the specification of the crystal manufacturing apparatus and changes of the specification of the crystal which it is desired to manufacture, in a simple and easy manner. In other words while, if the specification of the crystal manufacturing apparatus or the specification of the crystal which it is desired to manufacture is different, the profile of the power ratio set value also becomes different, if the control device is adapted to calculate the variable power ratio temperature set value automatically as described above, then this control device will be able to respond automatically to different power ratio set values. Moreover, by using this type of control device, during the crystal pulling up process, according to the current value of the power ratio, it is also possible to calculate and to output the current position of the variable power ratio temperature set value in real time.

Although embodiments of the present invention have been explained in the above, these embodiments have only been given as examples for explanation of the present invention; the range of the present invention is not to be considered as being limited to these embodiments. The present invention may also be implemented in various other manners, provided that its gist is not deviated from.

The invention claimed is:

1. A single crystal manufacturing apparatus according to the Czochralski method, comprising:
   multiple heaters for applying heat to a crucible;
   an elevating/lowering device which pulls up a crystal from said crucible;
   a temperature measurement device which measures an applied heat temperature, generated by heat applied by said heaters, at a predetermined site of said single crystal manufacturing apparatus;
   a diameter measurement device which measures the diameter of said crystal;
   a speed measurement device which measures the pulling up speed of said elevating/lowering device; and
   a control device configured to set a diameter set value, a speed set value, a variable power ratio temperature set value, and a power ratio set value; configured to input the measured values from said temperature measurement device, said diameter measurement device, and said speed measurement device; configured to control said pulling up speed by said elevating/lowering device and the electrical power of said multiple heaters on the basis of the values measured by said temperature measurement device, said diameter measurement device, and said speed measurement device, and of said diameter set value, said speed set value, and said variable power ratio temperature set value; and configured to make the power ratio of said multiple heaters agree with said power ratio set value;
   wherein:
   said power ratio set value changes according to the state of progression of the crystal pulling up process;
   said variable power ratio temperature set value changes along with the change of said power ratio set value, so as to become a temperature value which corresponds to the current value of said power ratio set value,
   said control device is configured to set said variable power ratio temperature set value so as to compensate for a change of the measured value of said applied heat temperature which occurs due to change of said power ratio set value, and
   said control device is configured to calculate said power ratio set value based on a target oxygen density and information in which the relationship between a current oxygen density and a current power ratio for attaining the oxygen density is determined.

2. A single crystal manufacturing apparatus according to claim 1, further comprising:
   a memory containing a data table prepared in advance, in which is defined a relationship between the measured value of said applied heat temperature which changes according to change of said power ratio set value, and a position of said crystal at a time point that said measured values are obtained,
   wherein said control device is configured to set said variable power ratio temperature set value on the basis of said data table.

3. A single crystal manufacturing apparatus according to claim 1, wherein, said control device is configured to shift said variable power ratio temperature set value from a first fixed power ratio temperature set value which corresponds to said first ratio value, to a second fixed power ratio temperature set value which corresponds to said second ratio value, when said power ratio set value changes from a first ratio value to a different second ratio value.

4. A single crystal manufacturing apparatus according to claim 1, wherein said control device is configured to control said pulling up speed so as to bring the measured value of said diameter close to said diameter set value; is configured to determine a temperature target value by adjusting said variable power ratio temperature set value so as to bring the measured value of said pulling up speed close to said speed set value; and is configured to control the electrical power to said multiple heaters so as to bring the measured value of said applied heat temperature close to said temperature target value, while making the power ratio of said multiple heaters agree with said power ratio set value.

5. A single crystal manufacturing apparatus according to claim 1, wherein said control device comprises a means for calculating said variable power ratio temperature set value, on the basis of said power ratio set value and information which specifies a relationship between said power ratio and said applied heat temperature.

6. A single crystal manufacturing apparatus according to the Czochralski method, comprising:
   multiple heaters for applying heat to a crucible;
   an elevating/lowering device which pulls up a crystal from the crucible;
   a temperature measurement device which measures an applied heat temperature, generated by heat applied by the heaters, at a predetermined site of the single crystal manufacturing apparatus to generate an actual temperature value;
   a diameter measurement device which measures the diameter of the crystal to generate an actual diameter value;
   a speed measurement device which measures the pulling up speed of the elevating/lowering device to generate an actual speed value; and
   a parameter setting device configured to set a diameter set value, a speed set value, a variable power ratio temperature set value, and a power ratio set value;
   a diameter controller configured to generate a speed command value based on the diameter set value and the actual diameter value
   a speed controller configured to generate a temperature target value based on the speed set value, the actual speed value, and the temperature set value;
   a temperature controller configured to generate a power command value based on the actual temperature value and the target temperature value;
   a power calculator configured to make a power ratio of the multiple heaters agree with the power ratio set value, and to make a total power of the multiple heaters agree with the power command value,
   wherein:
   the power ratio set value changes according to the state of progression of the crystal pulling up process; and
   the variable power ratio temperature set value changes along with the change of the power ratio set value, so as to become a temperature value which corresponds to the current value of the power ratio set value.

7. A single crystal manufacturing apparatus according to claim 6, wherein the parameter setting device is configured to set the variable power ratio temperature set value so as to compensate for a change of the measured value of the applied heat temperature which occurs due to a change of the power ratio set value.

8. A single crystal manufacturing apparatus according to claim 7, further comprising: a
- a memory containing a data table prepared in advance, in which a relationship is defined between the measured value of the applied heat temperature which changes according to change of the power ratio set value, and the position of the crystal at the time point that the measured values are obtained,
- wherein the parameter setting device is configured to set the variable power ratio temperature set value on the basis of the data table.

9. A single crystal manufacturing apparatus according to claim 7, wherein, the parameter setting device is configured to shift the variable power ratio temperature set value from a first fixed power ratio temperature set value which corresponds to the first ratio value, to a second fixed power ratio temperature set value which corresponds to the second ratio value, when the power ratio set value changes from a first ratio value to a different second ratio value.

10. A single crystal manufacturing apparatus according to claim 6,
- wherein the diameter controller is configured to bring the actual value of said diameter close to the diameter set value,
- wherein the speed controller is configured to determine a temperature target value by adjusting the variable power ratio temperature set value so as to bring the measured value of the pulling up speed close to the speed set value, and
- wherein the power calculator is configured to control the electrical power to the multiple heaters so as to bring the measured value of the applied heat temperature close to the temperature target value, while making the power ratio of the multiple heaters agree with the power ratio set value.

11. A single crystal manufacturing apparatus according to claim 6, further comprising variable power ratio temperature set value calculator configured to calculate the variable power ratio temperature set value based on the power ratio set value and information that specifies a relationship between the power ratio and the applied heat temperature.

12. A single crystal manufacturing apparatus according to claim 6, wherein said parameter setting device is configured to calculate said power ratio set value based on a target oxygen density and information in which the relationship between a current oxygen density and a current power ratio for attaining the oxygen density is determined.

* * * * *